(12) United States Patent
Schmidt et al.

(10) Patent No.: US 9,550,866 B2
(45) Date of Patent: Jan. 24, 2017

(54) ARYL GROUP-CONTAINING SILOXANE COMPOSITIONS INCLUDING ALKALINE EARTH METAL

(71) Applicant: Dow Corning Corporation, Midland, MI (US)

(72) Inventors: Randall Schmidt, Midland, MI (US); Kasumi Takeuchi, Ichihra (JP); Shengqing Xu, Midland, MI (US)

(73) Assignee: DOW CORNING CORPORATION, Midland, MI (US)

( * ) Notice: Subject to any disclaimer, the term of this patent is extended or adjusted under 35 U.S.C. 154(b) by 0 days.

(21) Appl. No.: 14/774,747

(22) PCT Filed: Mar. 14, 2014

(86) PCT No.: PCT/US2014/020216
§ 371 (c)(1),
(2) Date: Sep. 11, 2015

(87) PCT Pub. No.: WO2014/149670
PCT Pub. Date: Sep. 25, 2014

(65) Prior Publication Data
US 2016/0027974 A1   Jan. 28, 2016

Related U.S. Application Data

(60) Provisional application No. 61/789,881, filed on Mar. 15, 2013.

(51) Int. Cl.
| | | |
|---|---|---|
| *C08G 77/58* | (2006.01) | |
| *H01L 23/29* | (2006.01) | |
| *C08G 77/20* | (2006.01) | |
| *C08G 77/00* | (2006.01) | |
| *C08G 77/12* | (2006.01) | |
| *C08L 83/04* | (2006.01) | |
| *C08G 77/06* | (2006.01) | |
| *C08G 77/22* | (2006.01) | |
| *H01L 33/56* | (2010.01) | |
| *C08K 3/20* | (2006.01) | |
| *C08K 9/06* | (2006.01) | |

(52) U.S. Cl.
CPC ............... *C08G 77/58* (2013.01); *C08G 77/06* (2013.01); *C08G 77/12* (2013.01); *C08G 77/20* (2013.01); *C08G 77/22* (2013.01); *C08G 77/70* (2013.01); *C08G 77/80* (2013.01); *C08L 83/04* (2013.01); *H01L 23/296* (2013.01); *H01L 33/56* (2013.01); *C08K 3/20* (2013.01); *C08K 9/06* (2013.01)

(58) Field of Classification Search
CPC ......... C08G 77/12; C08G 77/20; C08G 77/58; C08G 77/80
See application file for complete search history.

(56) References Cited

U.S. PATENT DOCUMENTS

| | | | |
|---|---|---|---|
| 3,267,031 A | 8/1966 | Buehler | |
| 5,109,093 A | 4/1992 | Rees et al. | |
| 2009/0088547 A1* | 4/2009 | Schamschurin | C08G 77/08 528/14 |
| 2009/0286935 A1* | 11/2009 | Tonge | C08L 27/16 525/104 |
| 2010/0025724 A1 | 2/2010 | Bae et al. | |
| 2011/0034581 A1* | 2/2011 | Bae | C08G 77/04 523/122 |
| 2012/0142239 A1* | 6/2012 | Budden | C08L 83/04 442/59 |
| 2013/0267653 A1* | 10/2013 | Egawa | C08G 77/56 524/588 |

FOREIGN PATENT DOCUMENTS

| | | |
|---|---|---|
| CN | 103131189 A1 | 6/2013 |
| EP | 2441803 A1 | 4/2012 |
| WO | WO 2012/060272 * | 5/2012 |
| WO | WO 2012/078617 * | 6/2012 |
| WO | WO 2012/102852 A1 | 8/2012 |

OTHER PUBLICATIONS

English language abstract and machine-assisted translation extracted from espace.com database on Sep. 3, 2015, 25 pages.
International Search Report for Application No. PCT/US2014/020216 dated Sep. 19, 2014, 3 pages.

* cited by examiner

*Primary Examiner* — Marc Zimmer
(74) *Attorney, Agent, or Firm* — Howard & Howard Attorneys PLLC

(57) ABSTRACT

An aryl group-containing siloxane composition is formed by introducing an alkaline earth-metal as a part of the reaction product of an organopolysiloxane having at least two alkenyl groups per molecule and an organopolysiloxane having at least two silicon-bonded hydrogen atoms per molecule in the presence of a hydrosilylation catalyst, wherein at least one of the organopolysiloxanes includes an aryl group. The alkaline earth metal may be introduced via a heat stability composition or may alternatively be pre-reacted with the organopolysiloxane having at least two alkenyl groups per molecule. The aryl group-containing siloxane compositions may be utilized as an encapsulating layer for a light emitting device.

18 Claims, No Drawings

ARYL GROUP-CONTAINING SILOXANE COMPOSITIONS INCLUDING ALKALINE EARTH METAL

RELATED APPLICATIONS

This application is the National Stage of International Patent Application No. PCT/US2014/020216, filed on Mar. 4, 2014, which claims priority to and all the advantages of U.S. Provisional Patent Application No. 61/789,881, filed on Mar. 15, 2013, the content of which is incorporated herein by reference.

The present invention generally relates to aryl group-containing siloxane compositions, and more specifically to aryl group-containing siloxane compositions including alkaline earth metal.

Light emitting devices have been predominately used in the backlighting industry to provide better viewing properties of a display, such as a liquid crystal display (LCD), when the light emitting devices are placed behind the display. In recent years, light emitting devices have been utilized in the general lighting industry for use in light bulbs, lamps, flashlights, etc. Conventional light emitting devices, in both the backlighting industry and the general lighting industry, exhibit cool white light. Cool white light is characterized by having a bluish tint when compared to natural sunlight or incandescent light, which tend to have a warmer tint.

Conventional light emitting diodes (LEDs) include a plurality of LEDs. The LEDs may be of various types. The LEDs may also be referred to in the art as semiconductor diodes, chips or dies. In certain embodiments, the light emitting device can further include at least one supplemental light emitting diode spaced from the LEDs. The device further includes a luminescent layer that is spaced from the LEDs. Such arrangements may be referred to in the art as "remote package" constructs. Such packages may have different combinations of various LEDs and/or luminescent layers, which may be the same as or different from each other.

In addition, the light emitting device typically further includes an intervening layer that is disposed between the LEDs and the luminescent layer. The intervening layer can be in direct contact with at least one of (or all of) the LEDs, and/or the luminescent layer. Typically, the intervening layer is sandwiched between the LEDs and the luminescent layer.

In certain devices, the intervening layer is optically transparent (or non-scattering) and thus may also be referred to as an encapsulating layer, sometimes alternatively referred to as an encapsulant or an encapsulant layer. Typically, the encapsulating layer is free of any luminescent compounds so as to not scatter/interfere with light emitted by the LEDs and/or the luminescent layer, however in other devices the encapsulating layer includes luminescent compounds to scatter/interfere with light in a desired manner. The encapsulating layer is useful for protecting the luminescent layer and/or the LEDs. In some devices, the encapsulating layer is disposed over the luminescent layer and opposite the light emitting diode. It is to be appreciated that the light emitting device can further include one or more encapsulating layers disposed over each of or all of the LEDs.

In addition, the light emitting device may also include a light transmissive cover disposed over the luminescent layer opposite the LEDs. If utilized, the light transmissive cover is typically spaced from the luminescent layer. The light transmissive cover may be formed from various materials and may be formed from a material that is the same as or different from the material of the host material of the luminescent layer. For example, the light transmissive cover may be formed from a glass, an epoxy, or a polycarbonate. The light transmissive cover, when utilized, is useful for protecting the luminescent layer and the LEDs.

The light emitting device may also include at least one reflector disposed adjacent at least one of (or all of) the LEDs. The reflector is typically spaced from at least a portion of the luminescent layer. The reflector can be of various shapes, and typically has a dish, parabolic, or frustoconical shape. The LED(s) is/are typically disposed in the middle of the reflector(s); however, the LED(s) may also be offset from center. The reflector(s) can be formed from various materials, such as a metal. Various types of metals can be used to form the reflector and other materials may be used as well provided they provide a degree of reflection. The reflector(s) is/are useful for directing light emitted by the LEDs and, optionally, the luminescent layer, outwardly away from the device.

In addition, the light emitting device can also include any number of other additional components generally associated with conventional light emitting devices. For example, the light emitting device can include a heat sink. In addition, the light emitting device can be a circuit board, wire bonds, a submount, and/or a lens. If utilized, the circuit board can be programmed to include lighting controls such as dimming, light sensing and pre-set timing. Such controls are especially useful for remote packages.

As noted above, the encapsulating layer, when utilized, is preferably optically transparent and/or non-scattering. To achieve such properties, the encapsulating layer may be formed from various materials, including materials that are the same as or different from the host material of the luminescent layer. One exemplary composition that may be utilized to form the encapsulating layer is an aryl group-containing siloxane composition that is formed as the reaction product of an organopolysiloxane having at least two alkenyl groups per molecule and an organopolysiloxane having at least two silicon-bonded hydrogen atoms per molecule in the presence of a hydrosilylation catalyst, wherein one or both of the organopolysiloxanes include aryl-group functionality. The hydrosilylation catalyst, sometimes generically referred to as a platinum catalyst or platinum-type catalyst, promotes the hydrosilylation (addition) reaction of silicon bonded hydrogen group across unsaturated bonds.

Encapsulating layers formed from such aryl group-containing siloxane compositions are desirable because they cure at temperatures of 150° C. or less and have a light refractive index of about 1.55 and also because they provide barrier properties to protect the LEDs from water, oxidation, or other corrosive compounds.

However, one disadvantage of these aryl group-containing siloxane compositions is that they discolor (i.e., yellow) at temperatures of 170° C. and above in air. Such discoloration is thought to be attributed the oxidation of the aryl components of these compositions to form chromophores. The presence of such chromophores acts to absorb light of particular wavelengths and thus can reduce the light output for the light emitting device or change the color of the outputted light.

BRIEF SUMMARY OF THE INVENTION

The present invention provides an aryl group-containing siloxane composition comprising the reaction product of: (A) an organopolysiloxane having at least two alkenyl groups per molecule; (B) an organopolysiloxane having at least two silicon-bonded hydrogen atoms per molecule; and (C) a heat stabilizing composition comprising an alkaline earth metal; in the presence of (D) a hydrosilylation catalyst; wherein at least one of components (A) or (B) includes at least one aryl group.

The present invention also provides an aryl group-containing siloxane composition comprising the reaction product of: (A1) an alkaline earth metal-containing organopolysiloxane comprising M, D, T and/or Q units and having at least two alkenyl groups per molecule, wherein the at least two alkenyl groups are attached only via the M units and/or via the D units; and (B1) an organopolysiloxane having at least two silicon-bonded hydrogen atoms per molecule; in the presence of (C1) a hydrosilylation catalyst; wherein at least one of components (A1) or (B1) includes at least one aryl group.

The inclusion of an alkaline earth metal into either of these aryl group-containing siloxane compositions, when such compositions are cured, reduces discoloration of the resultant compositions at temperatures of 170° C. and above in air. In addition, the inclusion of the alkaline earth metal in these compositions does not alter or change the curing conditions for forming such compositions and does not adversely affect the physical properties of such cured compositions. Thus, the aryl group-containing siloxane compositions are ideally suited for use as an encapsulating layer for protecting the LEDs in the light emitting device wherein consistent light transmission is desired.

DETAILED DESCRIPTION OF THE INVENTION

The articles 'a', 'an', and 'the' each refer to one or more, unless otherwise indicated. All amounts, ratios, and percentages in this application are by weight, unless otherwise indicated.

The present invention is directed to methods for reducing discoloration of addition cured aryl group-containing siloxane compositions at high temperatures without altering or otherwise changing the curing conditions for forming such cured compositions and without adversely affecting the physical properties of the resultant cured composition. The present invention is also directed to the aryl group-containing siloxane compositions. In addition, the present invention is also directed to the use of such aryl group-containing siloxane compositions as an encapsulating layer for protecting LEDs in a light emitting device wherein consistent optical transmissivity (i.e., consistent light transmission) is desired.

To achieve such a reduction in discoloration (i.e., stabilization) of the addition cured aryl group-containing siloxane compositions at high temperatures such as 170° C. and above in air, an alkaline earth metal is introduced to the aryl group-containing siloxane compositions during their formation. In certain embodiments, the alkaline earth metal is introduced to the aryl group-containing siloxane compositions in the form of a heat stabilizing composition that is co-reacted with the components typically utilized to form the aryl group-containing siloxane compositions. Alternatively, the alkaline earth metal is co-reacted during the preparation of one of the components that are typically used to form the aryl group-containing siloxane compositions. Each method for introducing the alkaline earth metal to form the aryl group-containing siloxane compositions is described below.

In one exemplary embodiment, the aryl group-containing siloxane compositions of the present invention includes at least the following components: (A) an organopolysiloxane having at least two alkenyl groups per molecule; (B) an organopolysiloxane having at least two silicon-bonded hydrogen atoms per molecule; (C) a heat stabilizing composition comprising an alkaline earth metal; and (D) a hydrosilylation catalyst, wherein either component (A) or component (B), or both component (A) and component (B), include at least one aryl group.

More specifically, the aryl group-containing siloxane compositions comprise the reaction product of components (A), (B) and (C) in the presence of (D).

In certain embodiments, the molar ratio of silicon bonded hydrogen atoms in component (B) to alkenyl groups in component (A) (i.e., the SiH/Vi molar ratio) is greater than or equal to 1/1, alternatively from 1/1 to 3/1, alternatively from 1/1 to 1.2/1.

Component (A) of the aryl group-containing siloxane composition is an organopolysiloxane that contains at least two alkenyl groups per molecule. The alkenyl groups of component (A) may be represented by vinyl, allyl, butenyl, pentenyl, hexenyl, and heptenyl groups, of which the vinyl groups are most preferable. Bonding positions of the alkenyl groups in component (A) may be located at molecular terminals and/or on molecular-chain sides. Silicon-bonded groups other than alkenyl that may be contained in component (A) may comprise methyl, ethyl, propyl, butyl, pentyl, hexyl, heptyl, or similar alkyl groups; phenyl, tolyl, xylyl, naphthyl, biphenyl, indolyl, thienyl or similar aryl or aromatic groups; benzyl, phenethyl, or similar aralkyl groups; phenylthiophenyl groups, phenoxyphenyl groups, stilbenzyl groups, benzophenyl groups and/or chloromethyl groups, 3-chloropropyl groups, 3,3,3-trifluoropropyl groups, or similar halogenated alkyl groups. Of these, most preferable are methyl groups and phenyl groups.

Component (A) may have a linear, branched, cyclic, net-like, or partially-branched linear structure including siloxy units of the formula $R_3SiO_{1/2}$ ("M unit") and/or the formula $R_2SiO_{2/2}$ ("D unit") and/or the formula $RSiO_{3/2}$ ("T unit") and/or of the formula $SiO_{4/2}$ ("Q unit"). In these formulae, R designates univalent hydrocarbon groups more specifically exemplified by the aforementioned alkyl, alkenyl, aryl, aralkyl, and halogenated alkyl groups.

Aforementioned component (A) may be exemplified by the following compounds: a copolymer of methylvinylsiloxane and dimethylsiloxane having both molecular terminals capped with trimethylsiloxy groups, a methylvinylpolysiloxane having both molecular terminals capped with trimethylsiloxy groups, a copolymer of methylarylsiloxane, methylvinylsiloxane, and dimethylsiloxane having both molecular terminals blocked with trimethylsiloxy groups, a dimethylpolysiloxane having both molecular terminals capped with dimethylvinylsiloxy groups, methylvinylpolysiloxane having both molecular terminals capped with dimethylvinylsiloxy groups, a copolymer of methylvinylsiloxane and dimethylsiloxane having both molecular terminals capped with dimethylvinylsiloxy groups, a copolymer of methylarylsiloxane, methylvinylsiloxane, and dimethylsiloxane having both molecular terminals capped with dimethylvinylsiloxy groups or alternatively with phenylmethylvinylsiloxane groups or diphenylvinylsiloxane groups, an organopolysiloxane copolymer composed of siloxy units represented by the following formulae: $R^1_3SiO_{1/2}$, and $R^1_2SiO_{1/2}$, and $SiO_{4/2}$; an organopolysiloxane copolymer composed of siloxy units represented by the following formulae: $R^1_2R^2SiO_{1/2}$, and $SiO_{4/2}$; an organopolysiloxane copolymer composed of siloxy units represented by the following formulae: $R^1R^2SiO_{2/2}$, and $R^1SiO_{3/2}$; an organopolysiloxane copolymer composed of siloxy units represented by the following formulae: $R^1R^2SiO_{2/2}$, and $R^2SiO_{3/2}$; or mixture of two or more of the aforementioned organopolysiloxanes. In the above formulae, $R^1$ may represent univalent hydrocarbon groups other than alkenyl groups, such as aforementioned alkyl groups, aryl groups, aralkyl groups, and halogenated alkyl groups. Furthermore, in the above formulae, $R^2$ may represent alkenyl groups similar to those listed above. The alkenyl groups in the above formulae are not particularly limited but typically are defined as one or more of vinyl, allyl, butenyl pentenyl, hexenyl, heptenyl, or cyclohexenyl groups. Each alkenyl group may be the same or different and each may be independently selected from all others.

Component (B) is an organopolysiloxane having at least two silicon-bonded hydrogen atoms per molecule. Bonding positions of silicon-bonded hydrogen atoms in component (B) may be located on molecular terminals and/or on the molecular-chain sides. Silicon-bonded groups of component (B) may be exemplified by univalent hydrocarbon groups that are free of aliphatic unsaturated carbon-carbon bonds, such as the aforementioned alkyl groups, aryl groups, aralkyl groups, and halogenated alkyl groups. The methyl and phenyl groups are most preferable. Component (B) may have a linear, branched, cyclic, net-like, or a partially-branched linear molecular chain structure with siloxy units of the formula $R'_3SiO_{1/2}$ and/or $R'_2SiO_{2/2}$ and $R'SiO_{3/2}$ and/or of the formula $SiO_{4/2}$ (i.e, M, D, T and/or Q units). In the above formula, R' represents hydrogen atoms or univalent hydrocarbon groups free of aliphatic unsaturated carbon-carbon bonds, such as the aforementioned alkyl groups, aryl groups, aralkyl groups, and halogenated alkyl groups. When component (A) is composed of siloxy units of formula $RSiO_{3/2}$ and/or siloxy units of formula $SiO_{4/2}$, (B) component should preferably have a linear or a partially-branched linear molecular-chain structure.

There are no special restrictions with regard to viscosity of component (B) at 25° C. However, for better mechanical strength of the cured silicone body and handling conditions of the curable silicone composition, it is recommended to have a viscosity at 25° C. within the range of 5 to 100,000 mPa·s.

Aforementioned component (B) may be exemplified by the following compounds: a methylhydrogenpolysiloxane having both molecular terminals capped with trimethylsiloxy groups, a copolymer of methylhydrogenpolysiloxane and dimethylsiloxane having both molecular terminals capped with trimethylsiloxy groups, a copolymer of methylarylsiloxane, methylhydrogensiloxane, and dimethylsiloxane having both molecular terminals blocked with trimethylsiloxy groups, a dimethylpolysiloxane having both molecular terminals capped with dimethylhydrogensiloxy groups, a copolymer of methylarylsiloxane and dimethylsiloxane having both molecular terminals capped with dimethylhydrogensiloxy groups, a methylphenylpolysiloxane having both molecular terminals capped with dimethylhydrogensiloxy groups, an organopolysiloxane copolymer composed of siloxy units represented by the following formulae: $R^1_3SiO_{1/2}$, $R^1_2HSiO_{1/2}$, and $SiO_{4/2}$; and organopolysiloxane copolymer composed of siloxy units represented by the following formulae: $R^1_2HSiO_{1/2}$, and $SiO_{4/2}$; an organopolysiloxane copolymer composed of siloxy units represented by the following formulae: $R^1HSiO_{2/2}$, and $R^1SiO_{3/2}$; an organopolysiloxane copolymer composed of siloxy units represented by the following formulae: $R^1HSiO_{2/2}$, and $HSiO_{3/2}$; or mixture of two or more of the aforementioned organopolysiloxanes. In the above formulae, $R^1$ may represent univalent hydrocarbon groups other than alkenyl groups, such as those mentioned above. The alkenyl groups in the above formulae are not particularly limited but typically are defined as one or more of vinyl, allyl, butenyl pentenyl, hexenyl, heptenyl, or cyclohexenyl groups. Each alkenyl group may be the same or different and each may be independently selected from all others.

In the composition of the invention, component (B) should be used in an amount sufficient for curing the composition and to provide sufficient SiH groups sufficient to react with and consume the alkenyl functionality in component (A). In order to ensure sufficient curing without decrease of mechanical strength, component (B) should be used in an amount of 0.1 to 100 parts by weight for each 100 parts by weight of component (A).

Component (C) is heat stabilizing composition that is added in a sufficient amount to reduce the discoloration of the resultant aryl group-containing platinum-catalyzed siloxane composition at temperatures of 170° C. and above in air.

In certain embodiments, the heat stabilizing composition (C) is formed as the reaction product of (i) an alkaline earth metal hydroxide or alkaline earth metal hydroxide hydrate with (ii) at least one silicon-containing compound having functional groups reactive with the alkaline earth metal hydroxide or alkaline earth metal hydroxide hydrate.

The alkaline earth metal hydroxide or alkaline earth metal hydroxide hydrate (i) of component (C) may generally be represented by the formula (I): $M(OH)_2 \cdot pH_2O$, wherein M represents an alkaline earth metal and p ranges from 0 to 8.

In certain embodiments, the alkaline earth metal M is barium or strontium, alternatively barium. In certain embodiments, the alkaline earth metal hydroxide or alkaline earth metal hydroxide hydrate (i) is according to the formula (II): $Ba(OH)_2 \cdot pH_2O$, wherein p is 0 to 2.

In certain embodiments, the silicon-containing compound (ii) may be a silanol-functional silicon-containing compound such as a silanol-functional silane or siloxane. In other embodiments, the silicon-containing compound (ii) may be an alkoxy-functional silicon-containing compound such as an alkoxy-functional silane or siloxane. In still other embodiments, the silicon-containing compound (ii) may be a chloro-functional silicon-containing compound such as a chloro-functional silane or siloxane. In still other embodiments, the silicon-containing compound (ii) includes any combination of a silanol-functional silicon-containing compound and alkoxy-functional silicon-containing compound. In still other embodiments, the silicon-containing compound (ii) includes any combination of chloro-functional silicon-containing compounds.

In certain embodiments, component (ii) includes at least one silicon-containing compound according to the formula (III): $R^2_n(X)_ySiO_{((4-n-y)/2)}$. In these embodiments, the subscript n varies from 0.8 to 2.2 and the subscript y ranges from 0.01 to 3. Further, $R^2$ may individually represent hydrogen atoms or univalent hydrocarbon groups free of aliphatic unsaturated carbon-carbon bonds, such as alkyl groups, aryl groups, aralkyl groups, and halogenated alkyl groups. In certain embodiments, each $R^2$ is individually a methyl group or an aryl group. In certain of these embodiments, the aryl group is a phenyl group. In addition, $R^2$ may individually represent univalent hydrocarbon groups having aliphatically unsaturated carbon-carbon bonds, such as alkenyl groups including vinyl groups.

In addition, X of formula (III) comprises the functional groups that are reactive with component (i) and is an independently selected hydrolysable group selected from H, a halide group, —OR$^3$, —NHR$^3$, —NR$^3$R$^4$, —OOC—R$^3$, O—N=CR$^3$R$^4$, O—C(=CR$^3$R$^4$)R$^5$, and —NR$^3$COR$^4$, wherein R$^3$, R$^4$ and R$^5$ are each independently selected from H and a C$_1$-C$_{22}$ hydrocarbon group, and wherein R$^3$ and R$^4$ optionally can form a cyclic amine in the alkylamino group.

In certain of these embodiments, wherein the silicon-containing compound (ii) is a silanol-functional silicon-containing compound, X of formula (III) includes at least one OH group. In related embodiments, each individual X of formula (III) is an OH group.

In certain of these embodiments, wherein the silicon-containing compound (ii) is an alkoxy-functional silicon-containing compound, X of formula (III) includes at least one C$_1$-C$_4$ alkoxy group. In related embodiments, each individual X of formula (III) is a C$_1$-C$_4$ alkoxy group.

In embodiments wherein the silicon-containing compound (ii) is a chloro-functional silicon-containing compound, the hydrolysable group X is limited to Cl.

In certain embodiments, wherein the hydrolysable group X of formula (III) is Cl (i.e., wherein component (ii) is a chloro-functional silicon containing-compound), the heat stability composition (C) may be formed as the reaction product of the chloro-functional silicon-containing compound with an alkaline earth metal oxide (i'), as opposed to an alkaline earth metal hydroxide or alkaline earth metal hydroxide hydrate. Exemplary alkaline earth metal oxides (i') include barium oxide or strontium oxide.

To form component (C), the silicon-containing compound (ii) and component (i) or (i') are mixed and heated to a temperature sufficient to disperse component (i) or (i') into the silicon compound (ii), such as from 70° C. to 200° C. At this temperature, component (i) or (i') and (ii) react to form a (alkaline earth metal-O—Si) bond via a condensation-type reaction, which can be confirmed by Fourier transform infrared spectroscopy (FTIR) (for example, when the alkaline earth metal is barium, a Ba—O—Si bond appears as a new absorbance peak at 918 cm$^{-1}$). The by-product of the condensation-type reaction (either water for silanol groups, alcohol for alkoxy groups, or HCl for chloro-groups) is volatilized or otherwise removed during this reaction. The by-product formed is dependent upon the functionality of the hydrolysable group X on the silicon-containing compound (ii). The reaction of the silicon-containing compound (ii) and component (i) or (i') at temperatures from 70° C. to 200° C. is complete when the alkaline metal content of the resultant composition (C) is from 0.1 to 25 weight percent of the total weight of component (C), which can be measured by an inductively coupled plasma mass spectroscopy (ICP). The alkaline earth metal in composition (C) may be present in the (alkaline earth metal-O—Si bond), or in residual unreacted component (i) or (i') in close proximity to the bonded alkaline earth metal.

In certain embodiments, the amount of component (C) in the aryl group-containing siloxane composition is set such that the alkaline earth metal content comprises from about 0.1 to 5 weight percent of the total weight of the aryl group-containing siloxane composition, alternatively about 1 weight percent of the total weight of the aryl group-containing siloxane composition. Stated another way, the alkaline earth metal content comprises from 1 to 5000 parts in one million parts of the aryl group-containing siloxane composition.

Component (D) is a hydrosilylation catalyst that promotes the addition curing of the aryl group-containing siloxane composition of the invention.

The (D) hydrosilylation catalyst is not particularly limited and may be any known in the art.

In one embodiment, the (D) hydrosilylation catalyst includes a platinum group metal selected from platinum, rhodium, ruthenium, palladium, osmium or iridium, organometallic compounds thereof, or combinations thereof. In another embodiment, the (D) hydrosilylation catalyst is further defined as a fine platinum metal powder, platinum black, platinum dichloride, platinum tetrachloride; chloroplatinic acid, alcohol-modified chloroplatinic acid, chloroplatinic acid hexahydrate; and complexes of such compounds, such as platinum complexes of olefins, platinum complexes of carbonyls, platinum complexes of alkenylsiloxanes, e.g. 1,3-divinyltetramethyldisiloxane, platinum complexes of low molecular weight organopolysiloxanes, for example 1,3-diethenyl-1,1,3,3-tetramethyldisiloxane, complexes of chloroplatinic acid with β-diketones, complexes of chloroplatinic acid with olefins, and complexes of chloroplatinic acid with 1,3-divinyltetramethyldisiloxane.

Alternatively, the (D) hydrosilylation catalyst may be further defined as a rhodium compound, such as those expressed by formulae: RhX$_3$[(R$^4$)$_2$S]$_3$; (R$^5$$_3$P)$_2$Rh(CO)Q, (R$^5$$_3$P)$_2$Rh(CO)H, Rh$_2$Q$_2$Y$_4$, HfRh$_g$(En)$_h$Cl$_i$, or Rh[O(CO)R]$_{3-j}$(OH)$_j$, wherein each Q is independently a hydrogen atom, chlorine atom, bromine atom, or iodine atom, each Y is independently a methyl group, ethyl group, or a similar alkyl group, CO, C$_8$H$_{14}$, or 0.5 C$_8$H$_{12}$; each R$^4$ is independently a methyl, ethyl, propyl, or a similar alkyl group; a cycloheptyl, cyclohexyl, or a similar cycloalkyl group; or a phenyl, xylyl or a similar aryl group; each R$^5$ is independently a methyl group, ethyl group, or a similar alkyl group; phenyl, tolyl, xylyl, or a similar aryl group; methoxy, ethoxy, or a similar alkoxy group, wherein each "En" is ethylene, propylene, butene, hexene, or a similar olefin; subscript "f" is 0 or 1; subscript "g" is 1 or 2; subscript "h" is an integer from 1 to 4; subscript "i" is 2, 3, or 4; and subscript "j" is 0 or 1. Particularly suitable but non-limiting examples of rhodium compounds are RhCl(Ph$_3$P)$_3$, RhCl$_3$[S(C$_4$H$_9$)$_2$]$_3$, [Rh(O$_2$CCH$_3$)$_2$]$_2$, Rh(OCCH$_3$)$_3$, Rh$_2$(C$_8$H$_{15}$O$_2$)$_4$, Rh(C$_5$H$_7$O$_2$)$_3$, Rh(C$_5$H$_7$O$_2$)(CO)$_2$, and Rh(CO)[Ph$_3$P](C$_5$H$_7$O$_2$).

The (D) hydrosilylation catalyst may also be further defined as an iridium group compound represented by the following formulae: Ir(OOCCH$_3$)$_3$, Ir(C$_5$H$_7$O$_2$)$_3$, [Ir(Z)(En)$_2$]$_2$, or [Ir(Z)(Dien)]$_2$ wherein each "Z" is chlorine atom, bromine atom, iodine atom, or a methoxy group, ethoxy group, or a similar alkoxy group; each "En" is ethylene, propylene, butene, hexene, or a similar olefin; and "Dien" is cyclooctadiene)tetrakis(triphenyl). The (D) hydrosilylation catalyst may also be palladium, a mixture of palladium black and triphenylphosphine. The (D) hydrosilylation catalyst and/or any of the aforementioned compound may be microencapsulated in a resin matrix or core-shell type structure, or may be mixed and embedded in an thermoplastic organic resin powder, e.g. a methylmethacrylate resin, carbonate resin, polystyrene resin, silicone resin, or similar resin.

Two non-limiting exemplary hydrosilylation catalysts that may be utilized are Speier's catalyst ((C$_3$H$_6$)Pt$^{II}$Cl$_2$]$_2$) or Karstedt's catalyst (Platinum(0)-1,3-divinyl-1,1,3,3-tetramethyldisiloxane complex solution).

Typically, the (D) hydrosilylation catalyst is present/utilized in an amount of from 0.01 to 1,000 ppm (parts per million), alternatively 0.1 to 500 ppm alternatively 1 to 500 ppm, alternatively 2 to 100 ppm, based on the total weight of (A) and (B) and (C).

In another exemplary embodiment, as noted above, as opposed to introducing the alkaline earth metal via the heat stabilizing composition (C) as in the previous embodiment, the alkaline earth metal incorporated through co-reacting during the preparation of one of the components already used to form the aryl group-containing siloxane compositions.

As such, in certain embodiments, the aryl group-containing siloxane compositions of the present invention includes the following components: (A1) an alkaline earth metal-containing organopolysiloxane comprising M, D, T and/or Q units and having at least two alkenyl groups per molecule, wherein the at least two alkenyl groups are attached only via the M units and/or via the D units; (B1) an organopolysiloxane having at least two silicon-bonded hydrogen atoms per molecule; and (C1) a hydrosilylation catalyst, wherein either component (A1) or component (B1), or both component (A1) and component (B1), include at least one aryl group.

More specifically, the aryl group-containing siloxane compositions comprise the reaction product of components (A1) and (B1) in the presence of (C1).

Component (A1), as noted above, is an alkaline earth metal-containing organopolysiloxane comprising M, D, T and/or Q units and having at least two alkenyl groups per molecule, wherein the at least two alkenyl groups are attached only via the M units and/or via the D units.

In certain embodiments, component (A1) is formed as the reaction product of (a) an alkaline earth metal hydroxide or alkaline earth metal hydroxide hydrate with (b) at least one silicon-containing compound according to the formula (IV): $R^{11}_n(X^2)_y SiO_{((4-n-y)/2)}$.

The alkaline earth metal hydroxide or alkaline earth metal hydroxide hydrate (a) of component (A1) may generally be represented by the formula (V): $M(OH)_2 \cdot pH_2O$, wherein M represents an alkaline earth metal and p ranges from 0 to 8.

In certain embodiments, the alkaline earth metal M comprises barium or strontium, alternatively barium. In certain embodiments, the barium hydroxide or barium hydroxide hydrate is according to the formula (VI): $Ba(OH)_2 \cdot pH_2O$, wherein p is 0 to 2.

In certain embodiments, as noted above, component (b) is a silicon-containing compound according to the formula (IV): $R^{11}_n(X^2)_y SiO_{((4-n-2)/2)}$. In these embodiments, the subscript n ranges from 0.8 to 2.2 and the subscript y ranges from 0.01 to 3. Further, $R^{11}$ may individually represent hydrogen atoms or univalent hydrocarbon groups free of aliphatic unsaturated carbon-carbon bonds, such as alkyl groups, aryl groups, aralkyl groups, and halogenated alkyl groups. In certain embodiments, each $R^{11}$ is individually a methyl group or an aryl group. In certain of these embodiments, the aryl group of $R^{11}$ is a phenyl group. In addition, at least two $R^{11}$ groups, attached to a silicon atom via M units and/or D units, are univalent hydrocarbons having aliphatic unsaturated carbon-carbon double bonds, such as alkenyl groups or more preferably vinyl groups. In certain embodiments, each of the at least two alkenyl groups are vinyl groups.

In certain embodiments, at least 20 mole % of the alkenyl groups included in the silicon-containing compound according to formula (IV) are attached via the M units, while the remainder of the alkenyl groups are attached via the D units. More specifically, in embodiments, at least 20 mole % of the vinyl groups included in the siloxane according to formula (V) are attached via the M units, while the remainder of the vinyl groups are attached via the D units.

In addition, $X^2$ of formula (IV) comprises the functional groups that are reactive with component (a) and is an independently selected hydrolysable group selected from H, a halide group, $-OR^{12}$, $-NHR^{12}$, $-NR^{12}R^{13}$, $-OOC-R^{12}$, $O-N=CR^{12}R^{13}$, $O-C(=CR^{12}R^{13})R^{14}$, and $-NR^{12}COR^{13}$, wherein $R^{12}$, $R^{13}$ and $R^{14}$ are each independently selected from H and a $C_1$-$C_{22}$ hydrocarbon group, and wherein $R^{12}$ and $R^{13}$ optionally can form a cyclic amine in the alkylamino group.

In certain of these embodiments, wherein the silicon-containing compound of formula (IV) is a silanol-functional silicon-containing compound, $X^2$ of formula (IV) includes at least one OH group. In related embodiments, each individual $X^2$ of formula (IV) is an OH group.

In certain of these embodiments, wherein the silicon-containing compound of formula (IV) is an alkoxy-functional silicon-containing compound, $X^2$ of formula (IV) includes at least one $C_1$-$C_4$ alkoxy group. In related embodiments, each individual $X^2$ of formula (IV) is a $C_1$-$C_4$ alkoxy group.

In certain embodiments, the silicon-containing compound according to formula (IV) may be a silanol-functional silicon-containing compound such as a silanol-functional silane or siloxane. In other embodiments, the silicon-containing compound according to formula (IV) may be an alkoxy-functional silicon-containing compound such as an alkoxy-functional silane or siloxane. In still other embodiments, the silicon-containing compound according to formula (IV) may be a chloro-functional silicon-containing compound such as a chloro-functional silane or siloxane. In still other embodiments, the silicon-containing compound according to formula (IV) includes any combination of a silanol-functional silicon-containing compound and alkoxy-functional silicon-containing compound. In still other embodiments, the silicon-containing compound according to formula (IV) includes any combination of chloro-functional silicon-containing compounds.

In embodiments wherein the silicon-containing compound of formula (IV) is a chloro-functional silicon-containing compound, the hydrolysable group $X^2$ is limited to Cl.

Aforementioned component (b) may be exemplified by the following compounds: a copolymer of methylvinylsiloxane and dimethylsiloxane having both molecular terminals capped with trimethylsiloxy groups, a methylvinylpolysiloxane having both molecular terminals capped with trimethylsiloxy groups, a copolymer of methylarylsiloxane, methylvinylsiloxane, and dimethylsiloxane having both molecular terminals blocked with trimethylsiloxy groups, a dimethylpolysiloxane having both molecular terminals capped with dimethylvinylsiloxy groups, methylvinylpolysiloxane having both molecular terminals capped with dimethylvinylsiloxy groups, a copolymer of methylvinylsiloxane and dimethylsiloxane having both molecular terminals capped with dimethylvinylsiloxy groups, a copolymer of methylarylsiloxane, methylvinylsiloxane, and dimethylsiloxane having both molecular terminals capped with dimethylvinylsiloxy groups, an organopolysiloxane copolymer composed of siloxy units represented by the following formulae: $R^1_3SiO_{1/2}$, $R^1_2R^2SiO_{1/2}$, and $SiO_{4/2}$; an organopolysiloxane copolymer composed of siloxy units represented by the following formulae: $R^1_2R^2SiO_{1/2}$, and $SiO_{4/2}$; an organopolysiloxane copolymer composed of siloxy units represented by the following formulae: $R^1R^2SiO_{2/2}$, and $R^1SiO_{3/2}$; an organopolysiloxane copolymer composed of siloxy units represented by the following formulae: $R^1R^2SiO_{2/2}$, and $R^2SiO_{3/2}$; or mixture of two or more of the aforementioned organopolysiloxanes. In the above formulae, $R^1$ may represent univalent hydrocarbon groups other than alkenyl groups, such as aforementioned alkyl groups, aryl groups, aralkyl groups, and halogenated alkyl groups. Furthermore, in the above formulae, $R^2$ may represent alkenyl groups similar to those listed above. The alkenyl groups in the above formulae are not particularly limited but typically are defined as one or more of vinyl, allyl, butenyl pentenyl, hexenyl, heptenyl, or cyclohexenyl groups. Each alkenyl group may be the same or different and each may be independently selected from all others.

In certain embodiments wherein the hydrolysable group $X^2$ of formula (IV) is Cl, component (A1) may be formed as the reaction product of component (b) with an alkaline earth metal oxide (a'), as opposed to an alkaline earth metal hydroxide or alkaline earth hydroxide hydrate (a). Exemplary alkaline earth metal oxides (a') include barium oxide or strontium oxide.

Component (B1) is an organopolysiloxane having at least two silicon-bonded hydrogen atoms per molecule. The composition of component (B1) is the same composition as described above for component (B) and not repeated herein.

In the composition of the invention, component (B1) should be used in an amount sufficient for curing the composition and to provide sufficient SiH groups sufficient to react with and consume the alkenyl functionality in component (A1). In order to ensure sufficient curing without decrease of mechanical strength, component (B1) should be used in an amount of 0.1 to 100 parts by weight for each 100 parts by weight of component (A1).

Component (C1) is a hydrosilylation catalyst that promotes curing of the composition of the invention. The composition of component (C1) is the same composition as described above for component (D) and not repeated herein.

In the composition of the invention, component (C1) should be used in an amount sufficient for promoting curing of the aryl group-containing siloxane composition. In particular, in the present composition, it is preferable to use it in such a quantity that the amount of metallic platinum contained in component (C1), in weight units, stays in the range of 0.1 to 500 ppm, more preferably, in the range of 1 to 50 ppm.

In certain embodiments, the molar ratio of silicon bonded hydrogen atoms in component (B1) to alkenyl groups in component (A1) (i.e., the SiH/Vi molar ratio) is greater than or equal to 1/1, alternatively from 1/1 to 3/1, alternatively from 1/1 to 1.2/1.

The inclusion of an alkaline earth metal into these aryl group-containing siloxane compositions, in any of the embodiments described above, reduces discoloration of the addition cured aryl group-containing siloxane compositions at temperatures of 170° C. and above in air. The inclusion of an alkaline earth metal into these aryl group-containing siloxane compositions does not alter or otherwise change the curing conditions for forming such cured compositions and does not adversely affecting the physical properties of such cured compositions. Stated another way, the addition-cured compositions formed from the aryl group-containing siloxane compositions of the present invention are stabilized addition cured aryl group-containing siloxane compositions. Notably, the aryl group-containing siloxane compositions including the alkaline earth metal in accordance with the present invention still cure at temperatures of 150° C. or less and the cured compositions still have a light refractive index of about 1.55 and still provide barrier properties to protect the LEDs from water, oxidation, or other corrosive compounds. Thus, the aryl group-containing siloxane compositions according to the present invention are ideally suited for use as an encapsulating layer for protecting LEDs in a light emitting device wherein consistent light transmission is desired.

In certain additional embodiments, for example in embodiments in which the aryl group-containing siloxane compositions is used as an encapsulant composition for use in a light emitting device (i.e., wherein the encapsulant composition forms an encapsulating layer for protecting LEDs in a light emitting device) or otherwise utilized for forming semiconductor components, additional ingredients are typically included in the composition. Such additional ingredients may provide additional physical properties for the cured encapsulating layer or provide additional handling properties for the aryl group-containing siloxane compositions prior to application and curing.

A non-limiting list of additional ingredients that may be independently included in the aryl group-containing siloxane compositions of the present invention include, but are not limited to, hydrosilylation inhibitors, inorganic phosphors, spacers, thermally conductive and/or non-conductive fillers, reinforcing and/or non-reinforcing fillers, electrically conducting and/or non-conducting fillers, filler treating agents, adhesion promoters, plasticizers, solvents or diluents, wetting agents, surfactants, surface passive agents, flux agents, antimicrobial agents, silicone fluids, silicone waxes, rheology modifiers such as thickening agents or thixotropic agents or anti-sedimentation or anti-sagging, tackifiers, acid acceptors, hydrosilylation stabilizers, stabilizers such as heat stabilizers and/or UV stabilizers, pigment, dyes, and the like. Examples of the aforementioned additives are described in WO 2012/102852 A1 to Bhagwagar et al., which is expressly incorporated herein by reference but does not limit the instant invention. It is also contemplated that the gel and/or the electronic article of this invention may be free of one or more of any of the aforementioned additives. A few of these additives are described in more detail below.

Hydrosilylation inhibitors may be added to regulate the pot life of the aryl group-containing siloxane compositions of the present invention. Such inhibitors may be acetylenic alcohols such as 1-ethynyl-1-hydroxycyclohexane, 3-methyl-1-butyn-3-ol, 3,5-dimethyl-1-hexyn-3-ol, 3-methyl-1-penten-3-ol, phenylbutynol, an acetylenic alcohol, 3-methyl-3-penten-1-yn, 3,5-dimethyl-3-hexen-1-yn, triallyl isocyanurate, polyvinyl siloxane, and organophosphorus compounds, and fumarate or maleate. The hydrosilylation inhibitors may comprise from 1 to 1000 parts of hydrosilylation inhibitor per 1 million parts (i.e., 1 to 1000 ppm) of the aryl group-containing siloxane composition, alternatively from 5 to 2000 ppm, alternatively from 10 to 500 ppm.

Any inorganic phosphor can be added into the aryl group-containing siloxane compositions for the production of white-light-emitting semiconductor components, include Ce-doped YAG phosphors, cerium-doped garnet phosphors containing at least one element selected from Y, Lu, Sc, La, Gd and Sm and at least one element selected from Al, Ga and In), such as YAG:Ce ($Y_3Al_5O_{12}:Ce^{3+}$), and other garnets doped with rare earths, such as $Y_3Ga_5O_{12}:Ce^{3+}$, $Y(Al,Ga)_5O_{12}:Ce^{3+}$ and $Y(Al,Ga)_5O_{12}:Tb^{3+}$, as well as alkaline earth metal sulfides doped with rare earths, such as $SrS:Ce^{3+}$, Na, $SrS:Ce^{3+}$, Cl, $Srs:CeCl_3$, $CaS:Ce^{3+}$ and $SrSe:Ce^{3+}$. The thiogallates doped with rare earths, for example, $CaGa_2S_4:Ce^{3+}$ and $SrGa_2S_4:Ce^{3+}$, and aluminates doped with rare earths, such as, for example, $YAlO_3:Ce^{3+}$, $YGaO_3:Ce^{3+}$, Y(Al,Ga)O$_3$Ce$^{3+}$, and orthosilicates M$_2$SiO$_5$:Ce$^{3+}$ (M:Sc, Y, Sc) doped with rare earths, such as, for example, Y$_2$SiO$_5$: Ce$^3$, and all of the yttrium compounds, scandium compounds or lanthanum compounds.

This phosphor solid can be powder (objects) in micron size or in nanometer size. It surface can be modified or non-modified. They can be mixture or only one used into formulation. They can be soluble or insoluble into silicone formulation. They can be doped on other solid carrier and then added into the solid formulation.

The phosphor content may be 0 to 60 weight percent of the total weight of the aryl group-containing siloxane compositions, alternatively 1 to 60 weight percent, alternatively 3 to 50 weight percent.

Exemplary fillers that may be utilized in the aryl group-containing siloxane compositions of the present invention include silica powder such as fumed silica, precipitated silica, and silica aerogel. In certain embodiments, the surface of the silica powder can be treated with various agents such as organochlorosilanes, organodisilazanes and cyclic organopolysilazanes. Other exemplary fillers that may be included in the aryl group-containing siloxane compositions of the present invention include surface treated or untreated alumina powder. The fillers may be 0.1 to 20 weight percent of the total weight of the aryl group-containing siloxane compositions.

Still further, the aryl group-containing siloxane compositions may include glass microcapsules that are added in an amount of 0.1 to 20 weight percent of the total weight of the aryl group-containing siloxane compositions.

The aryl group-containing siloxane compositions may be prepared neat or in the presence of one or many solvents or diluents that are added to reduce the viscosity of the composition for processing and application. The solvents or diluents can be an alcohol such as methanol, ethanol, isopropanol, butanol, or n-propanol; a ketone such as acetone, methylethyl ketone, or methyl isobutyl ketone; an aromatic hydrocarbon such as benzene, toluene, or xylene; an aliphatic hydrocarbon such as heptane, hexane, or octane; a glycol ether such as propylene glycol methyl ether, dipropylene glycol methyl ether, propylene glycol n-butyl ether, propylene glycol n-propyl ether, or ethylene glycol n-butyl ether, a halogenated hydrocarbon such as dichloromethane, 1,1,1-trichloroethane or methylene chloride, chloroform, dimethyl sulfoxide, dimethyl acetonitrile, tetrahydrofuran, white spirits, mineral spirits, or naphtha. When utilized, the solvents or diluents may comprise from 5% to 70% of the total weight of the aryl group-containing siloxane compositions.

Curable aryl group-containing siloxane compositions according to the invention may be formed by simply mixing components (A)-(D) or (A1)-(C1) and any additional additives. The curable aryl group-containing siloxane composition may be provided in one part, although it is preferred for storage stability reasons, to provide the curable composition in two or more parts, preferably in two parts. The two part composition may then be mixed in the required proportions prior to its use. It is important to distribute the components over the two or more parts of curable aryl group-containing siloxane compositions in the correct fashion to promote storage stability. Accordingly, the aryl group-containing siloxane compositions can be formulated in a number of ways, provided that the hydrosilylation catalyst (either (D) or (C1)) is stored separately from the organopolysiloxane having at least two silicon-bonded hydrogen atoms per molecule (either (B) or (B1)). Pre-reacted combinations of each of the respective components and additives can also be used in a two part system. For example, components (A) and (D) and/or (C) as described in certain embodiments may be pre-formed and stored prior to being mixed with components (B) and/or (A) and/or (C) as described above. For another example, components (A1) and (C1) may be pre-formed and stored prior to being mixed with components (B1) and/or (A1) as described above.

In certain of these embodiments, combinations of the main ingredients and/or additives may be pre-mixed and stored for subsequent use, provided that the mixture of such components and/or additives is substantially non-reactive and hence storage stable.

To form the encapsulating layer for the light emitting device, each of the ingredients used to form the aryl group-containing siloxane composition described above, including any additional ingredients, can be mixed together in a mechanical mixer to form a mixture or alternatively may be hand-mixed with a spatula to form a mixture. The mechanical mixing may be any suitable type of industrial mixer such as a planetary mixer, a Ross mixer, Hobart mixer, a paddle mixer, a V blender, a ribbon blender, a double cone blender, a high shear mixer, a drum-blender including a dental mixer, a vortex mixer, kneading mixer such as kneader and a roller mixer, or the like.

The obtained liquid mixture can then be dispensed onto a substrate (such as onto a LED on a light emitting device), or into mold or into a device by pouring, or by a coating machine (brush, spray), or by an industrial dispensing machine such as a sprue picker, compressor, injector, extruder, or the like.

The liquid mixture may then be solidified into a solid by heat, and/or by light, and/or by moisture, and/or by radiation, and/or by drying. The mixture is then cured by heating the solidified mixture to a curing temperature from 50 to 250° C., alternatively 70 to 200° C., alternatively 100 to 160° C., for 2 minutes to 10 hours, alternatively 10 minutes to 2 hours to form the stabilized aryl group-containing siloxane compositions.

So that those skilled in the art can understand and appreciate the invention taught herein, the following examples are presented, it being understood that these examples should not be used to limit the scope of this invention found in the claims attached hereto.

COMPARATIVE EXAMPLES

1. Evaluation of Barium-Containing Heat Stabilizing Composition in PhMe Siloxane Fluid (Dow Corning 710)

A. Preparation of Barium Heat Stabilizing Composition

In an open flask with a mechanical stirrer and heating oil bath, a set amount of Ba(OH)$_2$.8H$_2$O solid was added into about 50 grams a dimethylsilanol terminal phenylmethyl siloxane fluid (M$^{OH}$-D$^{Ph}_{2.8}$-M$^{OH}$) and mixed to form a dispersion. This mixed dispersion was kept at 130-140° C. for 30-45 minutes to form a colorless uniform solution, and then cooled down to obtain the product (Samples 1-7, as shown in Table 1 below). As the barium content increased up to 12.5 wt % barium, the colorless sample was transformed from a transparent colorless liquid to cloudy paste. FTIR spectra confirmed the presence of Ba—O—Si bond in the molecules of the products, as a new peak appeared at 918 cm$^{-1}$. The barium content was measured by ICP spectrometer.

The reaction conditions and key features of the products are summarized in Table 1 below.

| Sample # | [Ba]/[SiOH] (mol/mol) | Ba Content (Wt %) Feeding | Ba Content (Wt %) ICP | Appearance | Flow Stability @ Temp (° C.) |
|---|---|---|---|---|---|
| 1 | 0.024 | 0.11 | 0.116 | Clear, colorless liquid | Flows very well @ 25° C. |
| 2 | 0.022 | 1.06 | 1.06 | Clear, colorless liquid | Flows well @ 25° C.; Flows very well @ 40° C. |
| 3 | 0.088 | 3.95 | 4.02 | Slightly cloudy, colorless liquid | Flows @ 25° C.; Flows well @ 40° C. |
| 4 | 0.133 | 5.70 | 5.78 | Cloudy, colorless liquid | Flows slowly @ 25° C.; Flows well @ 50° C. |
| 5 | 0.171 | 7.07 | 7.11 | Cloudy, colorless liquid | Flows slowly @ 25° C.; Flows well @ 50° C. |
| 6 | 0.272 | 10.3 | 10.3 | Cloudy, colorless liquid | Flows slowly @ 70° C.; Flows well @ 95° C. |
| 7 | 0.355 | 12.5 | 12.6 | Cloudy, colorless paste | Remains paste until 118° C. |

Table 1 confirmed that Samples 1 and 2 provided sufficient optical clarity to be evaluated in aryl-siloxane compositions as described further below.

B. Evaluation of Barium Heat Stabilizing Composition with Phenyl Siloxane Fluid for Discoloration 0.6 grams of Sample 1 or Sample 2 was introduced into 20 grams of phenyl siloxane fluid (Dow Corning® 710 fluid) to obtain a barium content of 34 ppm (with Sample 1) and 310 ppm (with Sample 2). Samples were prepared with or without 5 parts per million of platinum (Either (1) Speier's catalyst: Pt(II) complex (($H_2PtCl_6$ $xH_2O$) in isopropanol, $[(C_3H_6)Pt^{II}Cl_2]_2$) or (2) Karstedt's catalyst: Pt(0) complex, $Pt^0_2(DVTMDS)_3$). The samples prepared are summarized in Table 2 below.

The resultant samples (Examples A1-A3, B1-B3, and C1-C3) were all clear, colorless liquid mixtures at room temperature. The resultant samples were exposed to 235° C. in presence of air for 5 hours. A UV-Vis spectrometer (Shimazu UV-2401) was employed to measure the light transmission of the aged liquid samples. The transmission at 450 nm (absorbance in this region is consistent with yellowing) of the liquid samples was normalized to that at 800 nm (high transmission region even with yellowed materials). The percent transmission (% T@450/800) of each sample was used for discoloration evaluation. A higher % T@450/800 value indicates less absorbance at 450 nm and hence a less yellow appearance. The results are provided Table 3 below:

TABLE 2

| Ex. | Description | Alkaline earth metal Content (Wt %) | Alkaline earth metal Content (Parts per million parts of composition) | Platinum Metal Present (Part per million parts of composition) |
|---|---|---|---|---|
| A1 | Dow Corning® 710 fluid | 0% | 0 ppm | None |
| A2 | Dow Corning® 710 fluid with Sample 1 | 0.116% | 34 ppm | None |
| A3 | Dow Corning® 710 fluid with Sample 2 | 1.06% | 310 ppm | None |
| B1 | Dow Corning® 710 fluid and Platinum Catalyst (II) | 0% | 0 ppm | Pt(II) - 5 ppm |
| B2 | Dow Corning® 710 fluid and Platinum Catalyst (II) and Sample 1 | 0.116% | 34 ppm | Pt(II) - 5 ppm |
| B3 | Dow Corning® 710 fluid and Platinum Catalyst (II) and Sample 2 | 1.06% | 310 ppm | Pt(II) - 5 ppm |
| C1 | Dow Corning® 710 fluid and Platinum Catalyst (0) | 0% | 0 ppm | Pt(0) - 5 ppm |
| C2 | Dow Corning® 710 fluid and Platinum Catalyst (0) and Sample 1 | 0.116% | 34 ppm | Pt(0) - 5 ppm |
| C3 | Dow Corning® 710 fluid and Platinum Catalyst (0) and Sample 2 | 1.06% | 310 ppm | Pt(0) - 5 ppm |

TABLE 3

| Ex. | Description | Initial Color (% T@450/800) | Color After 5 hours aging at 235° C. (% T@450/800) |
|---|---|---|---|
| A1 | Dow Corning® 710 fluid | 97.2 | 98.4 |
| A2 | Dow Corning® 710 fluid with Sample 1 | 95.1 | 99.4 |

TABLE 3-continued

| Ex. | Description | Initial Color (% T@450/800) | Color After 5 hours aging at 235° C. (% T@450/800) |
|---|---|---|---|
| A3 | Dow Corning® 710 fluid with Sample 2 | 97.2 | 97.5 |
| B1 | Dow Corning® 710 fluid and Platinum Catalyst (II) | 96.7 | 56.9 |
| B2 | Dow Corning® 710 fluid and Platinum Catalyst (II) and Sample 1 | 97.6 | 77.0 |
| B3 | Dow Corning® 710 fluid and Platinum Catalyst (II) and Sample 2 | 95.0 | 92.6 |
| C1 | Dow Corning® 710 fluid and Platinum Catalyst (0) | 96.7 | 35.1 |
| C2 | Dow Corning® 710 fluid and Platinum Catalyst (0) and Sample 1 | 95.8 | 70.6 |
| C3 | Dow Corning® 710 fluid and Platinum Catalyst (0) and Sample 2 | 95.4 | 90 |

The results in Table 3 indicated that the PhMe siloxane fluid (Dow Corning® 710 fluid) was color stable during high temperature aging in the absence of platinum with or without the heat stability additive, as shown in Examples A1-A3. However, in the presence of either platinum catalyst, at a common loading used as a catalyst for addition cured phenyl siloxane encapsulating layer formulations, the PhMe siloxane fluid (Dow Corning® 710 fluid) became yellow upon aging (See Examples B1 and C1). However, the addition of the heat stability additive greatly reduced the amount of yellowing as shown in Examples B2-B3 and C2-C3.

2. Evaluation of Vinyl Group Introduction into Barium Heat Stability Compositions for Encapsulating Layers A. Preparation of Barium-Containing Vinyl Siloxane (RVi1)

300 grams of diphenyldisilanol, 90 grams of phenyltrimethoxysilane, 75 grams of divinyldimethoxysilane, 51.6 grams of vinyldimethylmethoxysilane, 1.17 grams of Ba(OH)$_2$.H$_2$O and 120 grams of xylene were added to a flask equipped with a mechanical stirrer, cold condenser, thermometer and a heating bath. The mixture was heated to reflux and kept at reflux temperature for 5 to 6 hours. While cooling, the liquid was purified by activated carbon black and then filtered through one filter with 0.22 μm pore size. The solution after filtration was stripped at 85° C. under reduced pressure for 3 hours. A transparent, colorless, viscous liquid was obtained as the final product (RVi1) and having a composition: $D^{Ph2}_{0.46}T^{Ph}_{0.20}D^{Vi}_{0.19}M^{Vi}_{0.15}$ as characterized by $^{29}$Si NMR.

B. Preparation of Barium-Containing Vinyl Siloxane (RVi2)

300 grams of diphenyldisilanol, 72 grams of vinyltrimethoxysilane, 93 grams of divinyldimethoxysilane, 1.17 g Ba(OH)$_2$.H$_2$O and 160 grams xylene were added to a flask equipped with a mechanical stirrer, cold condenser, thermometer and a heating bath. The mixture was heated to reflux and kept at reflux temperature for 5 to 6 hours. While cooling, the liquid was purified by activated carbon black and then filtered through one filter with 0.22 μm pore size. The solution after filtration was stripped at 85° C. under reduced pressure for 3 hours. A transparent, colorless, viscous liquid was obtained as the final product (RVi2) and having a composition: $D^{Ph2}_{0.54}D^{Vi}_{0.27}T^{Vi}_{0.19}$ as characterized by $^{29}$Si NMR.

C. Preparation of Encapsulant Composition with RVi1 or RVi2

Next, an encapsulant composition was prepared by adding 20 weight percent of RVi1 or RVi2 to a commercial encapsulant (Dow Corning® OE 6630 silicone LED encapsulant). Additional SiH-containing siloxane ($M^H_{0.6}T^{Ph}_{0.4}$) was added to this mixture to balance the additional vinyl introduced through either RVi1 or RVi2 and thus maintain an overall SiH/Vi molar ratio of 1.02.

3 grams of the resultant formulations (with 2 ppm platinum catalyst loading) were prepared and added to small aluminum pans and cured at 120° C. in a forced air oven. The gel time at 120° C. (time to solidification monitored by probing the sample surface with a small wooden dowel periodically) was determined and the samples were post-cured at 150° C. for 30 minutes prior to high temperature aging. The samples were then exposed to 234° C. in air for 70 hours (high temperature aging) and the degree of yellowing (discoloration) was determined using a BYK Colorimeter, which optically quantifies the yellowing as a b* value (where the higher the b* value, the more yellowing detected). The gel time and yellowing test results are shown in the Table 4 below:

TABLE 4

| Sample | Additive and Loading | Gel Time 120° C. (min) | b* value after High Temperature Aging (234° C.@ 70 Hours) |
|---|---|---|---|
| D (Control) | None | 1.5-2 minutes | 17.3 |
| E | (RVi1)/($M^H_{0.6}T^{Ph}_{0.4}$) (20 wt %) | 3-4 minutes | 6.3 |
| F | (RVi2)/($M^H_{0.6}T^{Ph}_{0.4}$) (20 wt %) | 24-44 minutes | 7.3 |

The results in Table 4 confirm that the introduction of barium to the encapsulant composition (Samples E and F) reduced discoloration of the encapsulant composition as compared to the control sample (Sample D).

Further, the introduction of vinyl functionality via M units (Sample E) did not appreciably affect gel times, while the incorporation of vinyl functionality via the T siloxy units (Sample F) did appreciably affect gel times.

3. Evaluation of Encapsulant Composition Modified with Barium for Discoloration

A. Preparation of Barium-Containing Vinyl Siloxane (RVi3)

100.0 grams of partially condensed phenyl silsequioxane resin ($T^{Ph}$ with 5 weight percent OH groups), 28 grams of vinyldimethylmethoxysilane (ViMe$_2$SiOMe)), 0.38 grams of barium hydroxide hydrate (Ba(OH)$_2$.H$_2$O), and 80 grams of xylene were added in a flask equipped with stirrer, thermometer, cold condenser, gas inlet/outlet and oil bath. After purging with nitrogen for 10 minutes, the system was heated to a refluxing temperature (80-81° C.) and held for 5 hours. The clear solution was cooled to about 40° C. and 2.0 grams of activated carbon black powder was added. Stirring was maintained at room temperature overnight, wherein the mixture was filtered through a nylon membrane with 0.45 μm pore size. The solution was then evaporated at reduced pressure at 85-87° C. for about 3 hours to remove all the volatile compounds. The final product (RVi3) was obtained as a transparent, colorless solid with a refractive index of 1.5504 (at 80° C.), and the molecular composition of $T^{Ph}_{0.75}M^{Vi}_{0.25}$ was determined by $^{29}$Si NMR spectral analysis.

B. Preparation of Barium-Containing Vinyl Siloxane (RVi4) With Reduced Barium Content RVi4 was prepared in a manner identical to RVi3 above, except the barium hydroxide hydrate (Ba(OH)$_2$.H$_2$O) content was reduced to 0.15 grams.

C. Preparation and Evaluation of Cured Phenyl Siloxane Encapsulation Composition with RVi3 or RVi4

RVi3 and RVi4 were formulated into a phenyl siloxane encapsulation composition with the following composition as shown in Table 5:

TABLE 5

| Component | Amount (Parts/100 Part formulation) |
|---|---|
| Vi Terminal PhMe siloxane | 18 |
| RVi3 or RVi4 | 58.5 |
| SiH terminal tetramethyl diphenyl trisiloxane | 20.5 |
| $M^H_{0.6}T^{Ph}_{0.4}$ | 3 |
| Platinum | 2.5 ppm |

To evaluate the phenyl siloxane encapsulation composition of Table 5, 3 grams of the formulations (with 2 ppm Platinum catalyst loading) were prepared and added to small aluminum pans and cured at 120° C. in a forced air oven. The gel time at 120° C. (time to solidification monitored by probing the sample surface with a small wooden dowel periodically) was determined and the samples were post-cured at 150° C. for 30 minutes prior to high temperature aging. The samples were then exposed to high temperature aging at temperatures of 234° C. in air for 70 hours and the degree of yellowing (discoloration) was determined using a BYK-Gardner Spectro-guide 45/0 Colorimeter, which optically quantifies the yellowing as a b* value where the higher the b* value the more yellowing detected. The gel time and yellowing test results are shown in Table 6 below:

TABLE 6

| Sample | RVi Additive | Barium loading | Barium content in synthesized solid resin (ppm) | Gel Time at 120° C. (min) | b* value following high temperature aging (70 hr @ 234° C.) |
|---|---|---|---|---|---|
| G | RVi3 | .38 g | 128 | 1.5 | 7.9 |
| H | RVi4 | .15 g | 45 | 1.5 | 16.3 |

As Samples G and H confirm, when compared to Sample D above in Table 4, the addition of Barium to the synthesis of encapsulation composition used to make the cured encapsulating layer resulted in reduced yellowing upon aging of the encapsulating layer without significantly affecting gel times.

The instant disclosure has been described in an illustrative manner, and it is to be understood that the terminology which has been used is intended to be in the nature of words of description rather than of limitation. Obviously, many modifications and variations of the instant disclosure are possible in light of the above teachings. It is, therefore, to be understood that within the scope of the appended claims, the instant disclosure may be practiced otherwise than as specifically described.

The invention claimed is:

1. An aryl group-containing siloxane composition comprising the reaction product of:
   (A) an organopolysiloxane having at least two alkenyl groups per molecule;
   (B) an organopolysiloxane having at least two silicon-bonded hydrogen atoms per molecule; and
   (C) a heat stabilizing composition comprising an alkaline earth metal;
   in the presence of (D) a hydrosilylation catalyst;
   wherein at least one of the ingredients (A) or (B) includes at least one aryl group, and
   wherein the heat stabilizing composition comprises the reaction product of:
   (i) an alkaline earth metal hydroxide or alkaline earth metal hydroxide hydrate comprising the formula: M(OH)$_2$.pH$_2$O, wherein M represents the alkaline earth metal and p ranges from 0 to 8; and
   (ii) at least one silicon-containing compound having functional groups reactive with component (i);
   wherein the alkaline earth metal M is present in an amount ranging from 0.1 to 25 weight percent of the total weight of the heat stabilizing composition.

2. The siloxane composition of claim 1, wherein the at least one silicon-containing compound is selected from a silanol-functional siloxane, a silanol-functional silane, an alkoxy-functional silane, an alkoxy-functional siloxane, or any combination thereof.

3. The siloxane composition of claim 1, wherein the at least one silicon-containing compound is selected from a chloro-functional siloxane, a chloro-functional silane, or any combination thereof.

4. An aryl group-containing siloxane composition comprising the reaction product of:
   (A) an organopolysiloxane having at least two alkenyl groups per molecule;
   (B) an organopolysiloxane having at least two silicon-bonded hydrogen atoms per molecule; and
   (C) a heat stabilizing composition comprising an alkaline earth metal;
   in the presence of (D) a hydrosilylation catalyst;
   wherein at least one of the ingredients (A) or (B) includes at least one aryl group, and wherein the heat stabilizing composition comprises the reaction product of:
   (i) an alkaline earth metal oxide; and
   (ii) at least one chloro-functional silicon-containing compound comprising a chloro-functional silane or a chloro-functional siloxane or a combination thereof.

5. An aryl group-containing siloxane composition comprising the reaction product of:
   (A1) an alkaline earth metal-containing organopolysiloxane comprising M, D, T and/or Q units and having at least two alkenyl groups per molecule, wherein the at least two alkenyl groups are attached only via the M units and/or via the D units;
   (B1) an organopolysiloxane having at least two silicon-bonded hydrogen atoms per molecule;
   in the presence of (C1) a hydrosilylation catalyst;
   wherein at least one of components (A1) or (B1) includes at least one aryl group.

6. The siloxane composition of claim 5, wherein at least 20 mole % of the at least two alkenyl groups are attached via the M units and the remainder of the at least two alkenyl groups are attached via the D units.

7. The siloxane composition of claim 5, wherein component (A1) comprises the reaction product of:

(i) an alkaline earth metal hydroxide or alkaline earth metal hydroxide hydrate comprising the formula: M(OH)$_2$.pH2O, wherein M represents an alkaline earth metal and p ranges from 0 to 8; and
(ii) at least one silicon-containing compound according to the formula:

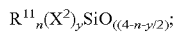

wherein
the subscript n ranges from 0.8 to 2.2;
the subscript y ranges from 0.01 to 3;
each X$^2$ individually represents a hydrolysable group;
each R$^{11}$ individually represents hydrogen atoms or univalent hydrocarbon groups free of aliphatic unsaturated carbon-carbon bonds or univalent hydrocarbon groups having aliphatic unsaturated carbon-carbon bonds, with the proviso that any R$^{11}$ comprising an aliphatic unsaturated carbon-carbon bonds is attached via an M unit and/or via a D unit.

8. The siloxane composition of claim 5, wherein component (A1) comprises the reaction product of:
(i) an alkaline earth metal oxide; and
(ii) at least one silicon-containing compound according to the formula:

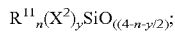

wherein
the subscript n ranges from 0.8 to 2.2;
the subscript y ranges from 0.01 to 3;
each X$^2$ individually represents a hydrolysable group and wherein at least one X$^2$ comprises Cl;
each R$^{11}$ individually represents hydrogen atoms or univalent hydrocarbon groups free of aliphatic unsaturated carbon-carbon bonds or univalent hydrocarbon groups having aliphatic unsaturated carbon-carbon bonds, with the proviso that any R$^{11}$ comprising an aliphatic unsaturated carbon-carbon bonds is attached via an M unit and/or via a D unit.

9. The siloxane composition according to claim 1 having a SiH/Vi molar ratio from 1:1 to 3:1.

10. A method for forming an aryl group-containing siloxane composition, the method comprising:
co-reacting the heat stabilizing composition of claim 1 with (A) an organopolysiloxane having at least two alkenyl groups per molecule and (B) an organopolysiloxane having at least two silicon-bonded hydrogen atoms per molecule in the presence of a hydrosilylation catalyst, wherein at least one of components (A) or (B) includes at least one aryl group.

11. A method for forming an aryl group-containing siloxane composition, the method comprising:

(a) forming an alkaline earth metal-containing organopolysiloxane comprising an alkaline earth metal and comprising M, D, T and/or Q units and having at least two alkenyl groups per molecule, wherein the at least two alkenyl groups are attached only via the M units and/or via the D units; and
(b) reacting component (a) with (i) an organopolysiloxane having at least two silicon-bonded hydrogen atoms per molecule in the presence of (ii) a hydrosilylation catalyst,
wherein at least one of components (a) or (i) includes at least one aryl group.

12. A light emitting device comprising an encapsulating layer comprising the aryl group-containing siloxane composition of claim 1.

13. A light emitting device comprising an encapsulating layer comprising the aryl group-containing siloxane composition of claim 5.

14. A method for forming an aryl group-containing siloxane composition, the method comprising:
co-reacting the heat stabilizing composition of claim 2 with (A) an organopolysiloxane having at least two alkenyl groups per molecule and (B) an organopolysiloxane having at least two silicon-bonded hydrogen atoms per molecule in the presence of a hydrosilylation catalyst, wherein at least one of components (A) or (B) includes at least one aryl group.

15. A method for forming an aryl group-containing siloxane composition, the method comprising:
co-reacting the heat stabilizing composition of claim 3 with (A) an organopolysiloxane having at least two alkenyl groups per molecule and (B) an organopolysiloxane having at least two silicon-bonded hydrogen atoms per molecule in the presence of a hydrosilylation catalyst, wherein at least one of components (A) or (B) includes at least one aryl group.

16. A method for forming an aryl group-containing siloxane composition, the method comprising:
co-reacting the heat stabilizing composition of claim 4 with (A) an organopolysiloxane having at least two alkenyl groups per molecule and (B) an organopolysiloxane having at least two silicon-bonded hydrogen atoms per molecule in the presence of a hydrosilylation catalyst, wherein at least one of components (A) or (B) includes at least one aryl group.

17. The siloxane composition according to claim 5 having a SiH/Vi molar ratio from 1:1 to 3:1.

18. A light emitting device comprising an encapsulating layer comprising the aryl group-containing siloxane composition of claim 4.

* * * * *